(12) United States Patent
Lee

(10) Patent No.: US 9,780,527 B1
(45) Date of Patent: Oct. 3, 2017

(54) DIRECT CURRENT SENSING OF LASING CURRENT PROVIDED THROUGH A SAFETY SWITCH

(71) Applicant: STMicroelectronics (Research & Development) Limited, Buckinghamshire (GB)

(72) Inventor: Denise Lee, Edinburgh (GB)

(73) Assignee: STMICROELECTRONICS (RESEARCH & DEVELOPMENT) LIMITED, Buckinghamshire (GB)

( * ) Notice: Subject to any disclaimer, the term of this patent is extended or adjusted under 35 U.S.C. 154(b) by 0 days.

(21) Appl. No.: 15/239,222

(22) Filed: Aug. 17, 2016

(51) Int. Cl.
| | |
|---|---|
| *H01S 3/13* | (2006.01) |
| *H01S 5/068* | (2006.01) |
| *G01R 19/00* | (2006.01) |
| *H01S 5/183* | (2006.01) |
| *H02H 3/08* | (2006.01) |
| *H01S 5/00* | (2006.01) |

(52) U.S. Cl.
CPC ...... *H01S 5/06808* (2013.01); *G01R 19/0038* (2013.01); *H01S 5/068* (2013.01); *H01S 5/183* (2013.01); *H02H 3/08* (2013.01); *H01S 5/0014* (2013.01)

(58) Field of Classification Search
CPC .... H01S 5/0014; H01S 5/183; H01S 5/06808; H01S 5/068
See application file for complete search history.

(56) References Cited

U.S. PATENT DOCUMENTS

| | | | | |
|---|---|---|---|---|
| 5,666,045 | A * | 9/1997 | Grodevant | H01S 5/042 323/282 |
| 2007/0080905 | A1* | 4/2007 | Takahara | G09G 3/3233 345/76 |
| 2014/0269799 | A1* | 9/2014 | Ortiz | H01S 5/0428 372/38.02 |
| 2017/0012406 | A1* | 1/2017 | Tanaka | H01S 5/042 |

* cited by examiner

*Primary Examiner* — Kinam Park
(74) *Attorney, Agent, or Firm* — Seed IP Law Group LLP

(57) ABSTRACT

One or more embodiments are directed to laser circuits, methods and devices that include a current sensing circuit for sensing a lasing current provided to a laser diode or device. One embodiment is directed to a circuit that includes a laser device, a switching device, a current sensing circuit and a current comparator. The switching device has a first conduction terminal coupled to the laser device and a second conduction terminal coupled to a supply voltage. The switching device is configured to operatively supply a lasing current to the laser device. The current sensing circuit is coupled to the switching device and is configured to generate a sense current representative of the lasing current. The current comparator is configured to receive the sense current from the current sensing circuit, to receive a reference current, and to compare the sense current with the reference current. If the sense current exceeds the reference current, the current comparator is configured to output an overcurrent detection signal.

20 Claims, 3 Drawing Sheets

DIRECT CURRENT SENSING OF LASING CURRENT PROVIDED THROUGH A SAFETY SWITCH

BACKGROUND

Technical Field

The present disclosure is generally directed to laser circuits, methods and devices, and more particular, to such circuits, methods and devices including current sensing circuitry to sense a lasing current provided to a laser diode through a safety switch.

Description of the Related Art

Laser devices (e.g., devices including one or more laser diodes) are utilized in a wide range of applications. For example, such laser devices are commonly used in imaging devices, such as time-of-flight ranging devices, proximity sensing devices, gesture recognition devices and the like, in which an output of the laser device is used to detect a proximity or distance to an object, by measuring a difference in a time of emitting the laser output and a time of receiving a portion of the laser output that is reflected off of the object.

Such laser devices may pose a safety risk, for example, if the laser output power is of a level high enough to impede vision, cause injury to the eyes or skin, or the like. Accordingly, lasers are generally classified based on accessible emission limits (AELs) into various classes, which generally prescribe limitations on the output power of laser devices based on the potential hazards posed.

The output power of such laser devices thus should be monitored or at least limited such that the laser device can be safely operated, i.e., such that the laser output does not exceed the maximum output power corresponding to its class.

The output power of a laser device may be proportionally related to the lasing current provided to the laser device. As such, the output power may be deduced based on sensing the lasing current. One such technique for sensing the lasing current involves sensing the current by providing a sensing resistor in series with the load (i.e., the laser device), and sensing the current through the sensing resistor. However, the addition of a dedicated resistive sensing element complicates the laser circuitry because an additional voltage drop will be present across the sensing resistor, which impedes or otherwise affects the laser device driver operation.

BRIEF SUMMARY

The present disclosure is generally directed to devices, systems and methods for monitoring an output power emitted from a laser device, such as a vertical-cavity surface-emitting laser (VCSEL), and to disable the laser emission if the output power exceeds a threshold power associated with safe operation.

In one or more embodiments, the present disclosure provides devices, systems and methods for sensing a current provided to the laser device. The sensed current is indicative of the output power emitted by the laser device. The current may be sensed indirectly, for example, by measuring a voltage drop across a safety switch (e.g., across the source and drain terminals of a transistor), which enables operation of the laser device and supplies current to the laser device. A current sense signal is generated, based on the voltage drop across the safety switch, in a current sensing circuit. The current sense signal may then be compared with a programmable reference current, and an overcurrent detection signal may be generated based on the comparison. The programmable reference current may represent a threshold output power for the laser device, i.e., the programmable reference current represents a maximum output power that can be safely emitted (or that can be emitted, for example, based on prescribed regulations, operating standards or the like) by the laser device. The current sense signal and the programmable reference current may be compared by a comparator circuit, which may include a Schmitt buffer for conditioning the comparator output.

The overcurrent detection signal is provided to a laser control circuit, which is configured to disable operation of the laser device if the overcurrent detection signal indicates an overcurrent condition (and thus an output power that exceeds the output power limit as represented by the programmable reference current).

In one embodiment, the present disclosure provides a circuit that includes a laser device, a switching device, a current sensing circuit and a current comparator. The switching device has a first conduction terminal coupled to the laser device and a second conduction terminal coupled to a supply voltage. The switching device is configured to operatively supply a lasing current to the laser device. The current sensing circuit is coupled to the switching device and is configured to generate a sense current representative of the lasing current. The current comparator receives the sense current from the current sensing circuit, and further receives a reference current. The current comparator compares the sense current with the reference current, and outputs an overcurrent detection signal if the sense current exceeds the reference current.

In another embodiment, the present disclosure provides a method that includes: sensing a lasing current supplied to a laser device through a transistor operating in a triode region; generating a sense current representative of the lasing current; comparing the sense current with a reference current representative of a maximum lasing current to be supplied to the laser device; and generating an overcurrent detection signal if the sense current exceeds the reference current.

In yet another embodiment, the present disclosure provides a device that includes a vertical-cavity surface-emitting laser (VCSEL), a current supply transistor, a current sensing circuit and a current comparator. The current supply transistor is coupled between the VCSEL and a supply voltage, and is configured to supply a lasing current to the VCSEL while operating in a triode region. The current sensing circuit is coupled to the current supply transistor and is configured to generate a sense current representative of the lasing current supplied to the VCSEL. The current comparator has a first terminal configured to receive the sense current from the current sensing circuit, and a second terminal configured to receive a reference current. The current comparator is configured to compare the sense current with the reference current and to output an overcurrent detection signal if the sense current exceeds the reference current.

Embodiments provided herein advantageously provide a variety of features and functionalities. For example, embodiments provided herein enable a laser device to be maintained within a particular accessible emission limit (AEL) of lasing optical output power for a particular Laser Safety Classification. Further, embodiments provided herein facilitate obtaining an accurate facsimile of lasing current, utilizing a resistive sensing element (i.e., a transistor operating in a triode or linear region) in series with the electrical current supply path of the laser device, which does not impede on the inherent operation of the laser device driver. This is because the transistor (i.e., the safety switch) is an inherent component needed for operation of the laser device driver, and thus it is already included as part of the laser device circuitry (as opposed to adding an additional resistive sensing element that would create additional voltage drop or otherwise skew the operation of the laser device).

Embodiments provided herein may thus provide a signal that is indicative of the status of the lasing current (e.g., an output signal indicating a laser output that is out of limits, overcurrent, over a power threshold, or the like). The output signal may be an analog signal, and is provided in order to monitor a translated level of the lasing current. The translated level (i.e., the signal indicative of the lasing current) may be a facsimile of the lasing current, but suitably scaled down for interpretation as desired. Additionally, this signal can be a digital signal, indicative of the lasing current being above or below a chosen programmable reference threshold as the set point, and thus may be utilized for automatically disabling the laser output and/or for providing an alert indicating that an overcurrent or over power condition has occurred.

DETAILED DESCRIPTION

Embodiments are directed to circuits, methods and devices for sensing a lasing current provided to a laser device, such as a laser diode, to enable detection of an over current or crossing of a safety threshold identified by a user or the manufacturer. In particular, embodiments provided by the present disclosure sense a current through a safety switch (e.g., a transistor) which provides the lasing current to the laser device. The safety switch may be a transistor that operates in the triode or linear region during operation of the laser device. Accordingly, the current through the safety switch may be determined based on a voltage drop across the safety switch, because in the triode region the current through and the voltage across the safety switch are linearly related to one another, based on a drain-source resistance.

Figure 1:
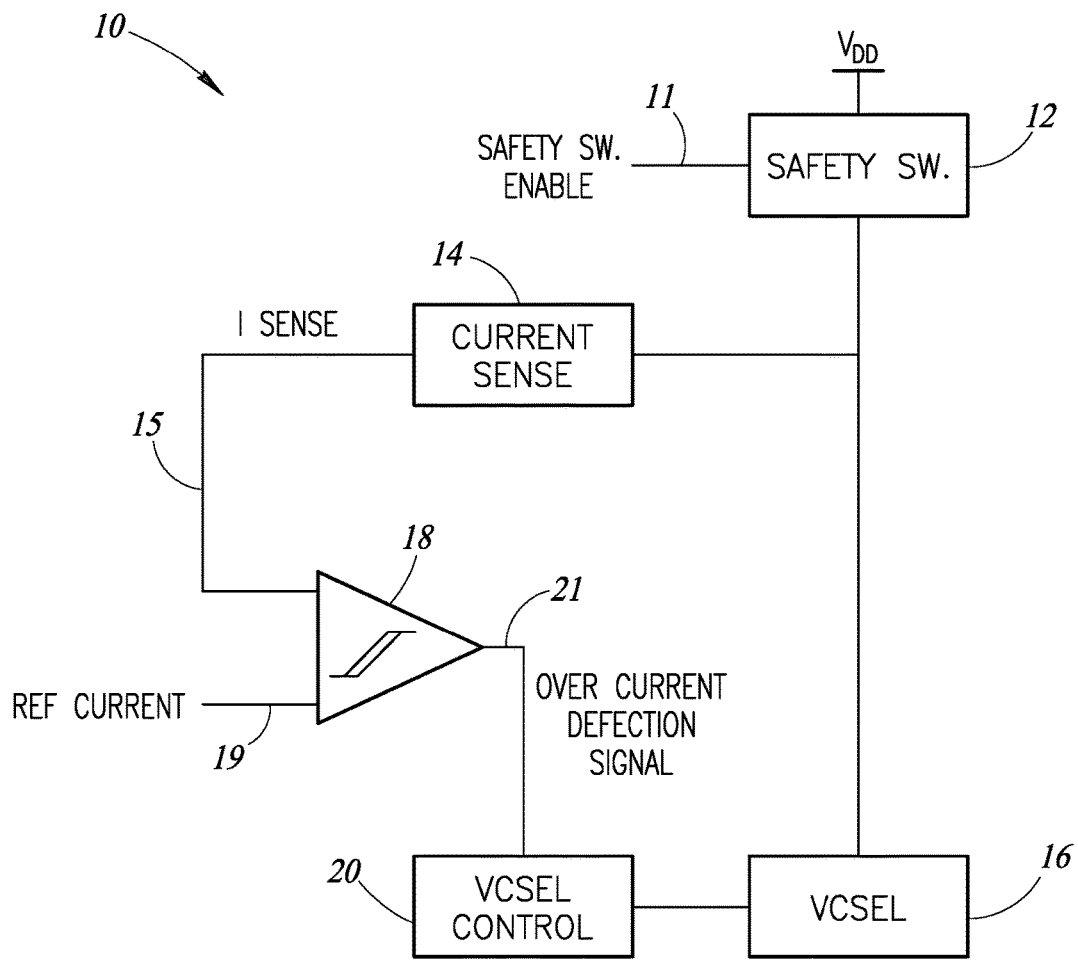
FIG. 1 is a block diagram illustrating a circuit for sensing a current provided to a laser diode, in accordance with one or more embodiments of the present disclosure.

FIG. 1 is a block diagram illustrating a circuit 10 for sensing a current provided to a laser diode 16 and adjusting operation of the laser diode based on the sensed current, in accordance with one or more embodiments of the present disclosure. The circuit 10 includes a safety switch 12, a current sensing circuit 14, and the laser diode, such as a vertical-cavity surface-emitting laser (VCSEL) 16. The circuit 10 may further include a current comparator 18, and a VCSEL controller 20, as shown in FIG. 1.

The safety switch 12 is coupled to the VCSEL 16 and provides a lasing current to the VCSEL 16. The safety switch 12 provides the lasing current to the VCSEL 16 when the safety switch 12 is turned on, for example, by a safety switch enable signal 11, which may be provided from the VCSEL controller 20. The safety switch 12 may be a MOSFET switch that is innate or built-in to the laser diode (e.g., the VCSEL 16) driver architecture, and serves the purpose of gating the electrical current path of the VCSEL 16, for which it is a safety mechanism. As such, the safety switch 12 may singularly prevent forward biasing of the VCSEL 16, and thus acts as a summing node of all lasing current. That is, all lasing current provided to the VCSEL 16 is provided via the safety switch 12.

The safety switch 12 may be coupled, in series, between the VCSEL 16 and either a positive incoming rail (e.g., the high side) of a DC voltage source $V_{DD}$ (as shown in FIG. 1), or a ground return path of the DC voltage source $V_{DD}$ (e.g., the low side). Where the safety switch 12 actually resides in the circuit 10 depends on the laser diode driving topology, which may be selected as desired. That is, the safety switch 12 may be provided as a high side or low side safety switch, and where the safety switch 12 resides in the circuit 10 (e.g., either high or low side) does not alter the performance of laser current sensing as described herein.

The current sensing circuit 14 senses the current provided to the VCSEL 16 indirectly, e.g., by sensing a voltage drop across the safety switch 12, as all of the current provided to the VCSEL 16 is provided through the safety switch 12. In that regard, the safety switch 12 may be or include a transistor (such as a MOSFET) that operates in the triode or linear region, in which the transistor operates like a resistor and the current through the transistor is linearly related to the voltage drop across the drain and source terminals of the transistor. That is, in the triode region, the current through the safety switch 12 may be determined based on the voltage drop across the safety switch 12.

The current sensing circuit 14 may be coupled to the drain and source terminals of the safety switch 12 which are provided as inputs to the current sensing circuit 14, and from which the current sensing circuit 14 may sense a differential voltage or the voltage drop across the safety switch 12 (Vsense). The voltage across the safety switch 12 (Vsense) may then be translated to an equivalent current sense signal 15 (Isense), as will be described in further detail herein.

The current sense signal 15 is indicative of the lasing current provided to the VCSEL 16, and may be a scaled version of the lasing current. That is, the current sense signal 15 represents, but is not necessarily an exact copy of, the current provided to the VCSEL 16.

The current sense signal 15 is provided to a first input terminal of the comparator 18, and a reference current signal 19 is provided to a second input terminal of the comparator 18. Accordingly, the current comparator 18 compares the current sense signal 15 with the reference current signal 19, and an overcurrent detection signal 21 may be generated based on the comparison by the current comparator 18.

The reference current signal 19 may be a programmable reference current signal and may be programmed or set, for example, during a manufacturing or assembly process of the circuit 10 and/or may be set by a user of the circuit 10 and/or a device including the circuit 10. The reference current signal 19 represents a threshold output power for the VCSEL 16, i.e., the reference current signal 19 represents a maximum output power that can be safely emitted (or that can be emitted, for example, based on prescribed regulations, operating standards or the like) by the VCSEL 16.

In one or more embodiments, the current comparator 18 may be a current comparator with hysteresis, such as a Schmitt trigger, as will be described in further detail herein.

The overcurrent detection signal 21 is provided to a laser control circuit, e.g., VCSEL controller 20, which is configured to disable operation of the VCSEL 16 if the overcurrent detection signal 21 indicates an overcurrent condition (and thus an output power that exceeds the output power limit as represented by the reference current 19).

Figure 2:
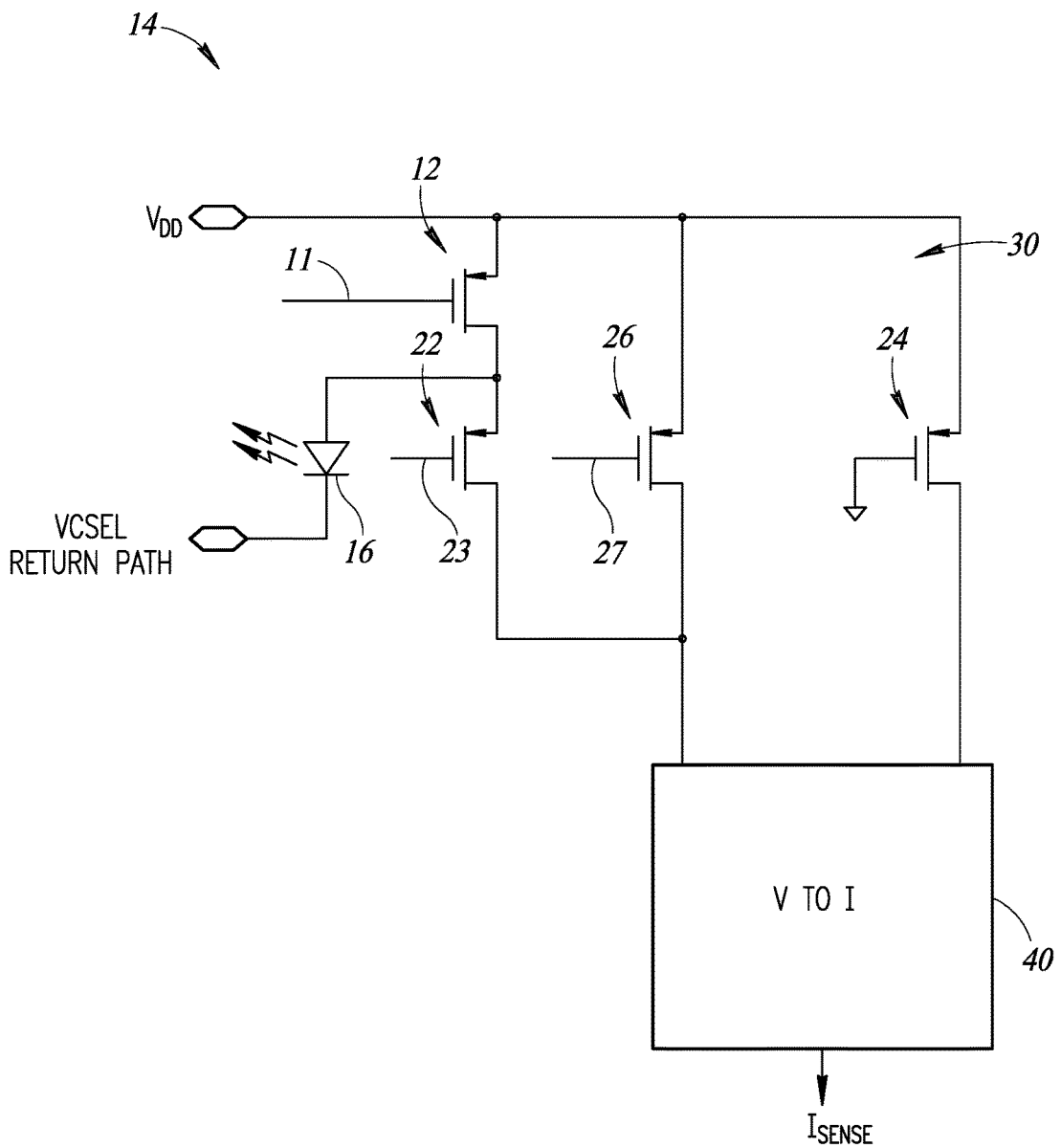
FIG. 2 is a circuit diagram illustrating further details of a current sense circuit of FIG. 1, in accordance with one or more embodiments.

FIG. 2 is a circuit diagram illustrating further details of the current sense circuit 14 shown in FIG. 1, in accordance with one or more embodiments. As shown in FIG. 2, the safety switch may be a transistor 12, such as a MOSFET.

The current sense circuit 14 may include a differential voltage sensor 30 that is configured to sense a difference in voltage between source and drain terminals of the safety switch transistor 12. As shown in FIG. 2, in one or more embodiments, the differential voltage sensor 30 may include a first sense transistor 22, and a second sense transistor 24. The first sense transistor 22 may be a PMOS transistor having a source terminal coupled to the drain terminal of the safety switch 12, as shown. The gate terminal of the first sense transistor receives a current sense enable signal 23 that, when present (e.g., a logic low or 0V signal), turns the first sense transistor 22 on, thereby enabling current sensing by the current sense circuit 14. The current sense enable signal 23 may be issued by a controller, which may be, for example, the VCSEL controller 20.

The second sense transistor 24 may be a PMOS transistor having a source terminal coupled to the source terminal of the safety switch 12 (e.g., coupled to one another via a common node receiving the power supply voltage $V_{DD}$) and the gate terminal may be tied to ground such that the second sense transistor 24 is always on during operation of the circuit 10.

Respective drain terminals of the first and second sense transistors 22, 24 are coupled to and provided as inputs to a voltage-to-current converter 40, which may be included in the current sense circuit 14.

The current sense circuit 14 may further include a third transistor 26 that is normally off when the first sense transistor 22 is on. The third transistor 26 is on, when the first sense transistor 22 is off, i.e., when the current sensing functionality is disabled. The third transistor 26 has a source terminal coupled to the source terminal of the safety switch 12, as well as to the source terminal of the second sense transistor 24. As such, when the third transistor 26 is on (and the first sense transistor 22 is off), sensing of the current through the safety switch 12 is disabled or is not utilized. The third transistor 26 may have a drain-source resistance ($R_{ds}$) matching that of the first sense transistor 22. The gate terminal of the third transistor 26 receives a current sense disable signal 27 that, when present, turns the third transistor 26 on, thereby disabling current sensing by the current sense circuit 14. The current sense disenable signal 27 may be issued by a controller, such as the VCSEL controller 20.

The first sense transistor 22 and the third transistor 26 may be controlled (e.g., by the VCSEL controller 20) using a make-before-break type operation. That is, one of the first sense transistor 22 and the third transistor 26 are always on during operation of the circuit 10. For example, if the third transistor 26 is turned on (i.e., by the current sense disable signal 27), to turn on the first sense transistor 22, and thus to enable current sensing through the current sensing circuit 14, the current sense enable signal 23 is issued to the gate terminal of the first sense transistor 22 while the third transistor 26 is still on. Once the first sense transistor 22 has been turned on, then the current sense disable signal 27 is issued to the gate terminal of the third transistor 26, thereby turning off the third transistor 26 after the first sense transistor 22 has been turned on. Similarly, if the first sense transistor 22 is turned on, to disable current sensing through the current sensing circuit 14, the third transistor 26 is turned on before turning off the first sense transistor 22.

The make-before-break operation of the first sense transistor 22 and the third transistor 26 prevents false triggering of an overcurrent status. That is, by turning one of the first sense transistor 22 and the third transistor 26 on before turning the other off, a situation where both of the first sense transistor 22 and the third transistor 26 are in an off state at the same time that the safety switch 12 is turned on is avoided. In the case where both the first sense transistor 22 and the third transistor 26 are off, but the safety switch 12 turns on, a glitch (e.g., a momentarily large voltage drop) across the first sense transistor 22 would be present when the first sense transistor 22 does turn on, in which case a false overcurrent condition could be sensed by the current sensing circuit 14. The make-before-break operation of the first sense transistor 22 and the third transistor 26 thus prevents such a false overcurrent condition from being detected.

The voltage-to-current converter 40 receives one or more signals representative of the voltage drop across the safety switch 12 (i.e., the differential voltage (Vsense) sensed by the differential voltage sensor 30, including the first and second sense transistors 22, 24) and converts or translates the sensed voltage drop into a current (Isense) representative of the lasing current provided to the VCSEL 16 through the safety switch 12 (i.e., the current sense signal 15).

The voltage-to-current converter 40 may include a feedback loop to control or force the current sense signal 15 to match an identical voltage drop across a unit transistor (i.e., a transistor of area dimension A) to that of the voltage drop across the safety switch 12 (Vsense). The unit transistor (A) may be, for example, the second sense transistor 24, which may be embedded within an array of matching unit transistors (N*A), including, for example, the first sense transistor 22 and the third transistor 26. The first and second sense transistors 22, 24 may have a ratio of their drain-source resistances that is selected as desired. In one or more embodiments, a ratio of the drain-source resistance ($R_{ds}$) of the first sense transistor 22 to the drain-source resistance ($R_{ds}$) of the second sense transistor 24 may be 4:3.

This allows for minimizing mismatch in manufacturing, which as a whole, the array of matching unit transistors (N*A) may form or may be otherwise electrically equivalent to the safety switch 12. Additionally, this has the effect of minimizing temperature dependent errors due to spatial placement.

The accuracy of translation of the lasing current to a scaled sensing current (Isense) is in large part determined by the ratio (A:N*A). Manufacturing mismatch, adhering to a phenomenon known in the art as Pelgrom scaling, may thus be a factor in designing the circuit 10 to have a desired accuracy. Sensing accuracy, which may depend in part on device area, is thus a design trade-off which primarily affects the bandwidth of sensing operation, and may be determined depending on application requirements.

The utilization of sensing current derived with matching device ratio means that the current sensing circuits and methods provided herein is immune to process variation from nominal, be it fast or slow process corners.

The voltage-to-current converter 40 thus outputs the current sense signal 15 (which is converted from the sensed voltage drop (Vsense) across the source and drain terminals of the safety switch 12) that is representative of the lasing current provided to the VCSEL 16 through the safety switch 12. As shown in FIG. 1, the output current sense signal 15 is provided to a current comparator 18.

Figure 3:
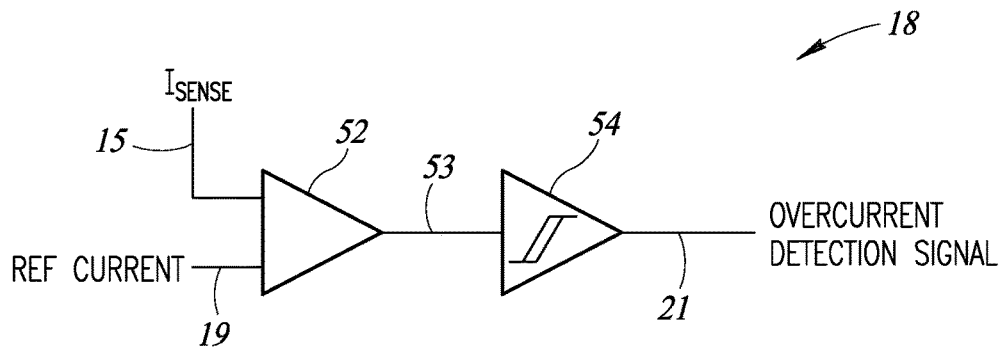
FIG. 3 is a circuit diagram illustrating further details of a current comparator of FIG. 1, in accordance with one or more embodiments.

FIG. 3 is a circuit diagram illustrating further details of the current comparator 18, in accordance with one or more embodiments. As shown in FIG. 3, the current comparator 18 may be a comparator circuit with hysteresis, such as a Schmitt trigger, that includes a current comparator stage 52 and a Schmitt buffer stage 54. The current comparator stage 52 receives the current sense signal 15 from the voltage-to-current converter 40 and compares the current sense signal 15 with the reference current signal 19. If the sensed current 15 exceeds the reference current 19, the output 53 of the current comparator stage 52 will indicate that an overcurrent condition exists. The output 53 of the current comparator stage 52 is provided as input to the Schmitt buffer stage 54, which provides additional noise immunity (i.e., signal conditioning) to the output of the current comparator stage 52. The conditioned signal output by the Schmitt buffer stage 54 is thus the overcurrent detection signal 21 which may be provided to the VCSEL controller 20 (as shown in FIG. 1). The reference current signal 19 may be a programmable reference current signal and may be programmed or set, for example, during a manufacturing or assembly process of the circuit 10 and/or may be set by a user of the circuit 10 and/or a device including the circuit 10.

As described above, the reference current signal 19 represents a threshold output power for the VCSEL 16, i.e., the reference current signal 19 represents a maximum output power that can be safely emitted (or that can be emitted, for example, based on prescribed regulations, operating standards or the like) by the VCSEL 16. Additionally, the reference current signal 19 may be a programmable signal, such that the maximum lasing current (which is representative of the maximum output power of the laser) may be selected as desired. The reference current signal 19 may be provided from the VCSEL controller 20, or from other control circuitry, The VCSEL controller 20 may disable the VCSEL 16 output based on receiving the overcurrent detection signal 21. For example, the VCSEL controller 20 may disable the safety switch 12 (e.g., by removing the safety switch enable signal 11), thereby preventing the lasing current from being provided to the VCSEL 16. Additionally, or alternatively, the VCSEL controller 20 may disable the VCSEL 16 output by automatically interrupting laser firing control circuitry within a VCSEL 16 driver circuit. The VCSEL controller 20 may further set a flag or otherwise provide an alert signal (e.g., an update to a host system status register) that indicates that an overcurrent condition has been detected.

Figure 4:
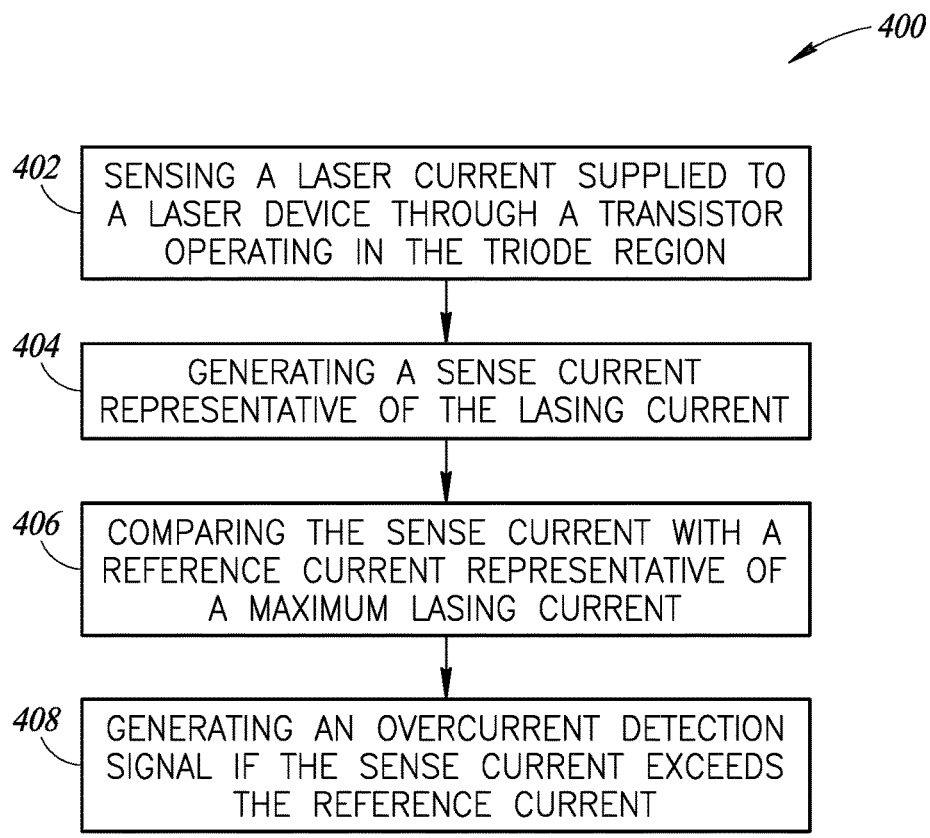
FIG. 4 is a flowchart illustrating a method for sensing a lasing current, in accordance with one or more embodiments.

FIG. 4 is a flowchart illustrating a method 400 for sensing a lasing current, in accordance with one or more embodiments of the present disclosure. As shown in FIG. 4, the method 400 includes, at block 402, sensing a lasing current supplied to a laser device through a transistor operating in a triode region. The transistor may be, for example, the safety switch 12, which provides the lasing current to the VCSEL 16 when the safety switch 12 is enabled.

At block 404, the method 400 includes generating a sense current 15 representative of the lasing current. The sense current 15 may be generated, for example, by the sense circuit 14. That is, in one or more embodiments, the sense current 15 may be generated by first sensing a voltage drop across the transistor (e.g., the safety switch 12) by the voltage sensor 30 (including, for example, the first and second sense transistors 22, 24). The sensed voltage drop may then be converted to the sense current 15 (Isense) by the voltage-to-current converter 40.

At block 406, the method 400 includes comparing the sense current 15 with a reference current 19 representative of a maximum lasing current to be supplied to the laser device. The sense current 15 may be compared with the reference current 19 by a current comparator 18, which may include a comparator stage 52 and a Schmitt buffer stage 54, for example, as shown in FIG. 3.

At block 408, the method 400 includes generating an overcurrent detection signal 21 if the sense current 15 exceeds the reference current 19. The overcurrent detection signal 21 may be generated, for example, by the comparator 18. Additionally, the overcurrent detection signal 21 may be provided to the controller 20, which may disable the output of the laser device (e.g., VCSEL 16) based on receiving the overcurrent detection signal 21.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
   a laser device;
   a switching device having a first conduction terminal coupled to the laser device and a second conduction terminal coupled to a supply voltage, the switching device being configured to operatively supply a lasing current to the laser device;
   a current sensing circuit coupled to the switching device and configured to generate a sense current representative of the lasing current; and
   a current comparator configured to receive the sense current from the current sensing circuit, to receive a reference current, and to compare the sense current with the reference current, the current comparator being configured to output an overcurrent detection signal if the sense current exceeds the reference current.

2. The circuit of claim 1, wherein the current sensing circuit includes:
   a differential voltage sensor configured to sense a voltage drop across the switching device and to output a voltage signal representative of the voltage drop across the switching device; and
   a voltage-to-current converter configured to receive the voltage signal representative of the voltage drop across the switching device, and to generate the sense current based on the received voltage signal.

3. The circuit of claim 2, wherein the differential voltage sensor includes:
   a first sense transistor having a first conduction terminal coupled to the second conduction terminal of the switching device, a second conduction terminal of the first sense transistor being coupled to an input of the voltage-to-current converter; and
   a second sense transistor having a first conduction terminal coupled to the first conduction terminal of the switching device, a second conduction terminal of the second sense transistor being coupled to a second input of the voltage-to-current converter.

4. The circuit of claim 3, further comprising a third transistor having a first conduction terminal coupled to the first conduction terminal of the switching device, and a second conduction terminal coupled to the second conduction terminal of the first sense transistor.

5. The circuit of claim 4, further comprising a controller, the controller being configured to keep at least one of the first transistor and third transistor turned on at all times during operation of the circuit.

6. The circuit of claim 1, further comprising:
a controller coupled to the current comparator, the controller being configured to receive the overcurrent detection signal, and to disable a laser output of the laser device in response to receiving the overcurrent detection signal.

7. The circuit of claim 1, wherein the laser device comprises a vertical-cavity surface-emitting laser (VCSEL).

8. The circuit of claim 1, wherein the switching device comprises a PMOS transistor, the PMOS transistor being configured to operate in a triode region during operation of the circuit.

9. The circuit of claim 1, wherein the current comparator includes:
a current comparator stage configured to compare the sense current with the reference current, and to output a signal indicative of an overcurrent condition if the sense current exceeds the reference current; and
and a Schmitt buffer stage configured to generate the overcurrent detection signal by conditioning the signal output by the current comparator stage.

10. A method, comprising:
sensing a lasing current supplied to a laser device through a transistor operating in a triode region;
generating a sense current representative of the lasing current;
comparing the sense current with a reference current representative of a maximum lasing current to be supplied to the laser device; and
generating an overcurrent detection signal if the sense current exceeds the reference current.

11. The method of claim 10, wherein sensing the lasing current includes:
sensing a voltage drop across the transistor;
generating a voltage signal representative of the voltage drop across the transistor; and
converting, in a voltage-to-current converter, the voltage signal representative of the voltage drop across the transistor to the sense current.

12. The method of claim 11, wherein sensing a voltage drop across the transistor includes:
sensing a first voltage at a first conduction terminal of the transistor; and
sensing a second voltage at a second conduction terminal of the transistor.

13. The method of claim 10, further comprising:
receiving, by a controller, the overcurrent detection signal; and
disabling a laser output of the laser device in response to receiving the overcurrent detection signal.

14. A device, comprising:
a vertical-cavity surface-emitting laser (VCSEL);
a current supply transistor coupled between the VCSEL and a supply voltage, the current supply transistor being configured to supply a lasing current to the VCSEL while operating in a triode region;
a current sensing circuit coupled to the current supply transistor and configured to generate a sense current representative of the lasing current supplied to the VCSEL; and
a current comparator having a first terminal configured to receive the sense current from the current sensing circuit, and a second terminal configured to receive a reference current, the current comparator being configured to compare the sense current with the reference current and to output an overcurrent detection signal if the sense current exceeds the reference current.

15. The device of claim 14, wherein the current sensing circuit includes:
a differential voltage sensor configured to sense a voltage drop across the current supply transistor and to output a voltage signal representative of the voltage drop across the current supply transistor; and
a voltage-to-current converter configured to receive the voltage signal representative of the voltage drop across the current supply transistor, and to generate the sense current based on the received voltage signal.

16. The device of claim 15, wherein the differential voltage sensor includes:
a first sense transistor configured to sense a first voltage at a first conduction terminal of the current supply transistor; and
a second sense transistor configured to sense a second voltage at a second conduction terminal of the current supply transistor.

17. The device of claim 16, further comprising:
a controller coupled to an output of the current comparator, the controller being configured to receive the overcurrent detection signal, and to disable an output of the VCSEL in response to receiving the overcurrent detection signal.

18. The device of claim 17, wherein the controller is further configured to output an alert signal in response to receiving the overcurrent detection signal.

19. The device of claim 14, wherein the current comparator includes:
a current comparator stage configured to compare the sense current with the reference current, and to output a signal indicative of an overcurrent condition if the sense current exceeds the reference current; and
a Schmitt buffer stage configured to generate the overcurrent detection signal by conditioning the signal output by the current comparator stage.

20. The device of claim 14, wherein the device comprises at least one of a time-of-flight ranging device, a proximity sensor, and a gesture recognition device.

* * * * *